US009472872B2

(12) United States Patent
Broughton et al.

(10) Patent No.: US 9,472,872 B2
(45) Date of Patent: Oct. 18, 2016

(54) ELECTRICAL HARNESS

(71) Applicant: ROLLS-ROYCE PLC, London (GB)

(72) Inventors: Paul Broughton, Leicester (GB); Jonathan Wilson, Ashby-de-la-Zouch (GB)

(73) Assignee: ROLLS-ROYCE PLC, London (GB)

( * ) Notice: Subject to any disclaimer, the term of this patent is extended or adjusted under 35 U.S.C. 154(b) by 48 days.

(21) Appl. No.: 13/659,324

(22) Filed: Oct. 24, 2012

(65) Prior Publication Data
US 2013/0114220 A1 May 9, 2013

(30) Foreign Application Priority Data

Nov. 4, 2011 (GB) .................................... 1119045.1

(51) Int. Cl.
*H01R 12/61* (2011.01)
*H01R 12/58* (2011.01)
*H01R 12/70* (2011.01)
*H01R 13/52* (2006.01)
*F02C 7/32* (2006.01)
*H05K 3/36* (2006.01)

(52) U.S. Cl.
CPC ............... *H01R 12/616* (2013.01); *F02C 7/32* (2013.01); *H01R 12/585* (2013.01); *H01R 12/61* (2013.01); *H01R 12/7064* (2013.01); *H01R 13/5213* (2013.01); *H05K 3/365* (2013.01); *Y02T 50/672* (2013.01)

(58) Field of Classification Search
CPC H01R 12/61; H01R 12/585; H01R 13/5213; H01R 2201/26; H01R 12/59; H01R 12/616
See application file for complete search history.

(56) References Cited

U.S. PATENT DOCUMENTS

| 4,526,432 | A | | 7/1985 | Cronin et al. |
| 4,647,133 | A | | 3/1987 | Renken et al. |
| 4,975,068 | A | | 12/1990 | Squires |
| 5,194,010 | A | * | 3/1993 | Dambach ............... H01R 12/57 439/499 |

(Continued)

FOREIGN PATENT DOCUMENTS

| DE | 10146626 A1 | 4/2003 |
| EP | 0 106 990 A1 | 5/1984 |

(Continued)

OTHER PUBLICATIONS

Search Report issued in British Patent Application No. 1219084.9 dated Feb. 27, 2013.

(Continued)

*Primary Examiner* — Adrian S Wilson
(74) *Attorney, Agent, or Firm* — Oliff PLC

(57) ABSTRACT

An electrical harness is formed from a flexible printed circuit board which provides a plurality of conductive tracks. The harness has one or more harness connectors at respective terminating regions of the flexible printed circuit board for joining the harness to complementary connectors. The or each harness connector includes a back-shell and one or more elongate terminals which are supported at a position within the back-shell such that, in use, when the harness connector joins with a complementary connector, the elongate terminals are presented for electrical connect at first ends thereof with mating terminals of the complementary connector. The or each terminating region of the harness has one or more receiving holes extending to respective conductive tracks of the harness.

12 Claims, 4 Drawing Sheets

(56) References Cited

U.S. PATENT DOCUMENTS

| | | | |
|---|---|---|---|
| 5,482,473 A | 1/1996 | Lord et al. | |
| 5,567,167 A | 10/1996 | Hayashi | |
| 5,620,782 A | 4/1997 | Davis et al. | |
| 5,770,818 A * | 6/1998 | Tanaka et al. | 174/84 R |
| 5,805,402 A | 9/1998 | Maue et al. | |
| 5,827,081 A * | 10/1998 | Sakamaki | 439/164 |
| 6,024,580 A * | 2/2000 | Dangler et al. | 439/67 |
| 6,299,469 B1 | 10/2001 | Glovatsky et al. | |
| 7,033,208 B1 | 4/2006 | Huang et al. | |
| 7,095,601 B2 * | 8/2006 | Mehrer et al. | 361/253 |
| 7,223,105 B2 | 5/2007 | Weiss et al. | |
| 7,553,166 B2 | 6/2009 | Gobron | |
| 7,731,517 B2 | 6/2010 | Lee et al. | |
| 7,980,863 B1 | 7/2011 | Holec et al. | |
| 8,529,276 B2 | 9/2013 | Esquivel et al. | |
| 8,529,277 B2 | 9/2013 | Williams et al. | |
| 8,668,503 B2 | 3/2014 | Williams et al. | |
| 9,178,295 B1 | 11/2015 | Lin et al. | |
| 9,338,830 B2 | 5/2016 | Broughton et al. | |
| 2003/0092295 A1 | 5/2003 | Lin | |
| 2003/0092296 A1 | 5/2003 | Oldenburg et al. | |
| 2004/0018757 A1 | 1/2004 | Lang et al. | |
| 2005/0079772 A1 * | 4/2005 | DeLessert | 439/700 |
| 2005/0118864 A1 * | 6/2005 | Watanabe et al. | 439/567 |
| 2007/0184682 A1 * | 8/2007 | Gobron | 439/67 |
| 2009/0233465 A1 | 9/2009 | Mizoguchi | |
| 2012/0315773 A1 | 12/2012 | Esquivel et al. | |
| 2012/0315774 A1 | 12/2012 | Williams et al. | |
| 2013/0114220 A1 | 5/2013 | Broughton et al. | |

FOREIGN PATENT DOCUMENTS

| | | |
|---|---|---|
| EP | 0 198 566 A2 | 10/1986 |
| EP | 0 261 527 A2 | 3/1988 |
| EP | 0 440 305 A1 | 8/1991 |
| EP | 0 911 913 A2 | 4/1999 |
| FR | 2 830 375 A1 | 4/2003 |
| GB | 929802 | 6/1963 |
| GB | 2070349 A | 9/1981 |
| GB | 2461017 A | 12/2009 |
| GB | 2463867 A | 3/2010 |

OTHER PUBLICATIONS

Search Report issued in European Patent Application No. 12 18 9697 dated Apr. 4, 2013.
Mar. 2, 2012 Search Report issued in British Application No. GB 1119045.1.
Search Report issued in British Application No. 1119050.1 dated Mar. 2, 2012.
Search Report issued in British Application No. 1219088.0 dated Feb. 22, 2013.
U.S. Appl. No. 13/659,336, filed Oct. 24, 2012.
British Search Report for Application No. 1308028.8 issued Oct. 28, 2013.
British Search Report for Application No. 1308029.6 issued Oct. 28, 2013.
May 5, 2014 Office Action issued in U.S. Appl. No. 13/659,336.
U.S. Appl. No. 14/260,614, filed Apr. 24, 2014.
U.S. Appl. No. 14/260,610, filed Apr. 24, 2014.
May 28, 2014 Search Report issued in European Patent Application No. 14 16 2598.
Jan. 29, 2015 Search Report issued in European Application No. 14 16 2597.
Apr. 8, 2016 Office Action issued in U.S. Appl. No. 14/260,610.
Jul. 28, 2016 Office Action Issued In U.S. Appl. No. 14/260,614.

* cited by examiner

ELECTRICAL HARNESS

CROSS-REFERENCE TO RELATED APPLICATIONS

This application is based upon and claims the benefit of priority from British Patent Application Number 1119045.1 filed 4 Nov. 2011, the entire contents of which are incorporated by reference.

FIELD OF THE INVENTION

The present invention relates to an electrical harness formed from a flexible printed circuit board.

BACKGROUND OF THE INVENTION

With reference to FIG. 1, a ducted fan gas turbine engine generally indicated at 10 has a principal and rotational axis X-X. The engine comprises, in axial flow series, an air intake 11, a propulsive fan 12, an intermediate pressure compressor 13, a high-pressure compressor 14, combustion equipment 15, a high-pressure turbine 16, and intermediate pressure turbine 17, a low-pressure turbine 18 and a core engine exhaust nozzle 19. A nacelle 21 generally surrounds the engine 10 and defines the intake 11, a bypass duct 22 and a bypass exhaust nozzle 23.

The gas turbine engine 10 works in a conventional manner so that air entering the intake 11 is accelerated by the fan 12 to produce two air flows: a first air flow A into the intermediate pressure compressor 13 and a second air flow B which passes through the bypass duct 22 to provide propulsive thrust. The intermediate pressure compressor 13 compresses the air flow A directed into it before delivering that air to the high pressure compressor 14 where further compression takes place.

The compressed air exhausted from the high-pressure compressor 14 is directed into the combustion equipment 15 where it is mixed with fuel and the mixture combusted. The resultant hot combustion products then expand through, and thereby drive the high, intermediate and low-pressure turbines 16, 17, 18 before being exhausted through the nozzle 19 to provide additional propulsive thrust. The high, intermediate and low-pressure turbines respectively drive the high and intermediate pressure compressors 14, 13 and the fan 12 by suitable interconnecting shafts.

A typical gas turbine engine has a substantial number of electrical components which serve, for example, to sense operating parameters of the engine and/or to control actuators which operate devices in the engine. Such devices may, for example, control fuel flow, variable vanes and air bleed valves. The actuators may themselves be electrically powered, although some may be pneumatically or hydraulically powered, but controlled by electrical signals.

Electrical power and signals to and from the individual electrical components are commonly transmitted along conductors. Conventionally, such conductors may be in the form of wires and cables which are assembled together in a harness. In such a conventional harness, each wire may be surrounded by an insulating sleeve. The connections between the individual components and the conventional harness are made, for example, by multi-pin plug and socket connectors. Similarly, communication between the harness and power, control and signalling circuitry is achieved through a multi-pin connector.

By way of example, FIG. 2 of the accompanying drawings shows a typical gas turbine engine including two conventional wiring harnesses 102, 104, each provided with a respective connector component 106, 108 for connection to circuitry accommodated within the airframe of an aircraft in which the engine is installed.

The harnesses 102, 104 are assembled from individual wires and cables which are held together over at least part of their lengths by suitable sleeving or braiding. Individual wires and cables, for example those indicated at 110, emerge from the sleeving or braiding to terminate at plug or socket connector components 112 for cooperation with complementary socket or plug connector components 114 on, or connected to, the respective electrical components.

Each conventional harness 102, 104 therefore comprises a multitude of insulated wires and cables. This makes the conventional harness bulky, heavy and difficult to manipulate. It is desirable to reduce the size and weight of components on gas turbine engines, particularly, for example, gas turbine engines for use on vehicles, such as aircraft.

It is proposed to replace conventional harnesses with flexible printed circuit board harnesses (FPCB harnesses). An example of a portion of a flexible printed circuit board harness 120 is shown in FIGS. 3 to 6. FIG. 3 shows a perspective view of an FPCB harness portion, and FIGS. 4, 5, and 6 show side, top, and cross-sectional views respectively.

The FPCB harness 120 typically comprises a flexible (for example elastically deformable) substrate 140 with conductive tracks 130 laid/formed therein. The FPCB harness 120 may thus be deformable. In the example shown in FIGS. 3 to 6, the FPCB harness 120 extends along a length in the x-direction, a width in the y-direction, and a thickness (or height or depth) in the z-direction. The x direction may be defined as the axial direction of the FPCB harness. Thus, the x-direction (and thus the z-direction) may change along the length of the FPCB harness 20 as the FPCB harness is deformed. The x-y surface(s) may be said to be the major surface(s) of the FPCB harness. In the example shown in FIGS. 3 to 6, the FPCB harness is deformable in the z direction, i.e. in a direction perpendicular to the major surface. FPCB harnesses may be additionally of alternatively deformable about any other direction, and/or may be twisted about any one or more of the x, y, or z directions.

The flexible substrate 140 is typically a dielectric, and the conductive tracks 130, which may be surrounded be the substrate, are typically formed using a suitable conductive material. The conductive tracks 130 may be used to conduct/transfer electrical signals and/or electrical power, for example around a gas turbine engine and/or to/from components of a gas turbine engine. The size (for example the cross-sectional area) and/or the shape of the conductive tracks 130 can depend on the signal to be transmitted through the particular conductive track 130. Thus, the shape and/or size of the individual conductive tracks 130 may or may not be uniform in a FPCB harness 120.

The example shown in FIGS. 3 to 6 has two layers of conductive tracks 130 running through the substrate 140, with three tracks in each layer. However, the number of layers and the number of tracks in the FPCB harness 120 can vary.

Using an FPCB harness to transmit electrical signals and/or power can be advantageous over a conventional harness, for example because of its reduced size, weight and/or complexity.

FIG. 7 shows a diagrammatic representation of an FPCB harness for an engine. The harness comprises a trunk 136 extending between connectors 141, 142, and a plurality of integral spurs 144 terminating at connectors 146. The trunk 136 and spurs 144 are generally flat, parallel to the plane of FIG. 7, but may be curved in that plane for ease of routing of the harness over the gas turbine engine. At least some of the tracks of the FPCB extend both along the trunk 136 and the respective spurs 144.

GB A 2463867 proposes connectors 141, 142, 146 for such a harness which take the form of sockets for respective plugs. Each socket comprises a back-shell made up of a body and a lid. A region of the part of the FPCB forming one of the spurs 144 projects into the back-shell through a "letterbox" opening defined between the body and the lid. An array of terminal pins is mounted on this region of the spur. The pins are a press fit into holes in the spur, and each has an enlarged head to locate it in the correct lengthwise position. Each pin passes through a respective conductive track on the spur so that it is in electrical contact with that track. The pins are presented in the back-shell for engagement with a complementary array of hollow terminal elements in the plug.

OBJECTS AND SUMMARY OF THE INVENTION

An aim of the present invention is to provide an electrical harness formed from a flexible printed circuit board which provides improved capability for making connections to and disconnections from the harness, particularly on-wing connections and disconnections.

In a first aspect, the present invention provides an electrical harness formed from a flexible printed circuit board which provides a plurality of conductive tracks, the harness having one or more harness connectors at respective terminating regions of the flexible printed circuit board for joining the harness to complementary connectors, wherein:

the or each harness connector includes a back-shell and one or more elongate terminals which are supported at a position within the back-shell such that, in use, when the harness connector joins with a complementary connector, the elongate terminals are presented for electrical connect at first ends thereof with mating terminals of the complementary connector;

the or each terminating region of the harness has one or more receiving holes extending to respective conductive tracks of the harness, the terminating region making a detachable press fit connection to the respective harness connector, by which connection second ends of the elongate terminals of the harness connector are received in the receiving holes to electrically connect the elongate terminals with the conductive tracks; and the elongate terminals are supported within the harness connector such that, when the harness connector is disconnected form the complementary connector, and when the terminating region is detached from the harness connector, the elongate terminals retain said position within the back-shell.

Advantageously, the terminating region makes a detachable press fit connection to the harness connector. In addition, however, the terminals are supported within the harness connector back-shell independently of their connection with mating terminals of the complementary connector and of the press fit connection with the terminating region, i.e. the terminals are supported even when the first ends of the elongate terminals do not mate with the terminals of the complementary connector and when the second ends of the elongate terminals of the harness connector are removed from the receiving holes. This allows the terminating region and/or the complementary connector to be disconnected from the harness connector to facilitate assembly/maintenance and reduce a risk that the terminals will be lost or damaged.

In a second aspect, the present invention provides a gas turbine engine having the electrical harness according to the first aspect.

Optional features of the invention will now be set out. These are applicable singly or in any combination with any aspect of the invention.

Typically, the conductive tracks of the harness fan out in the or each terminating region. Such an arrangement can help to increase the spacing between the receiving holes.

The receiving holes can be through holes or blind holes, as appropriate. The receiving holes may optionally include respective embedded sockets which engage with the second ends of the elongate terminals and are connected to the conductive tracks of the harness.

Substantially the whole of the inner surface of the or each receiving hole may be coated with an electrically conducting layer. This can improve the electrical connection between the terminals and the conductive tracks.

Each terminating region may be substantially planar and the one or more receiving holes may be arranged such that the elongate terminals extend out of the plane of the terminating region. For example, the elongate connection members may extend substantially perpendicularly to the plane of the terminating region. This arrangement allows the harness to approach the harness connector at an angle to the joining direction of the harness connector and complementary connector. Conveniently each terminating region can be disc-shaped. The terminating region may then be compatible with a typically circular cross-sectioned harness connector.

Preferably, the or each harness connector further includes a fixation formation which urges the respective terminating region into engagement with the back-shell. For example, the fixation formation can be provided by a resilient member and a lid of the back-shell, the resilient member being compressed between the terminating region and the lid.

Conveniently, the elongate terminals may be supported within the harness connector by a retaining body.

Further optional features of the invention are set out below.

BRIEF DESCRIPTION OF THE DRAWINGS

Embodiments of the invention will now be described by way of example with reference to the accompanying drawings in which.

DETAILED DESCRIPTION AND FURTHER OPTIONAL FEATURES OF THE INVENTION

Figure 1:
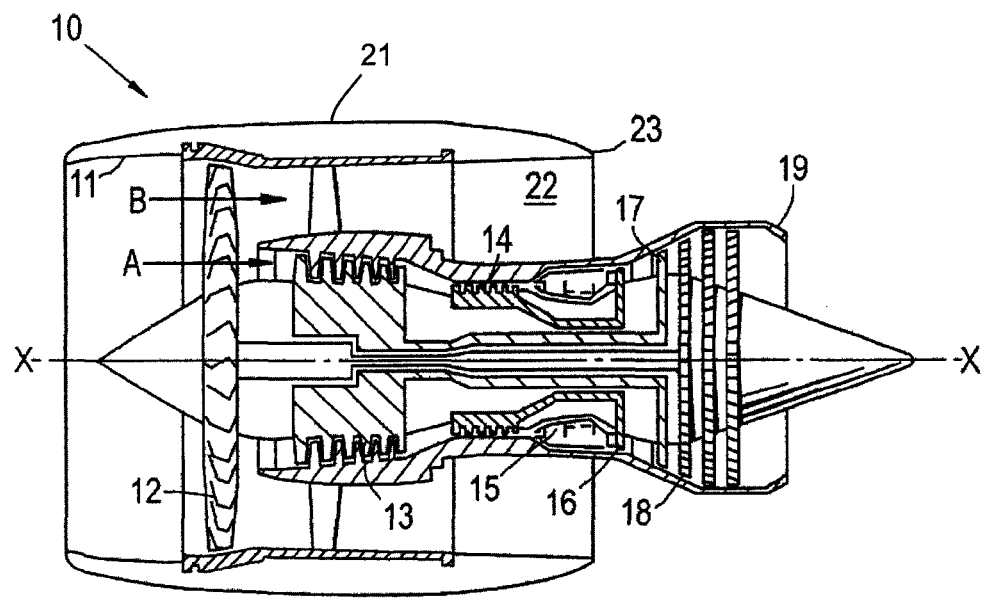
FIG. 1 shows a schematic longitudinal cross-sectional view through a ducted fan gas turbine engine.
Figure 2:
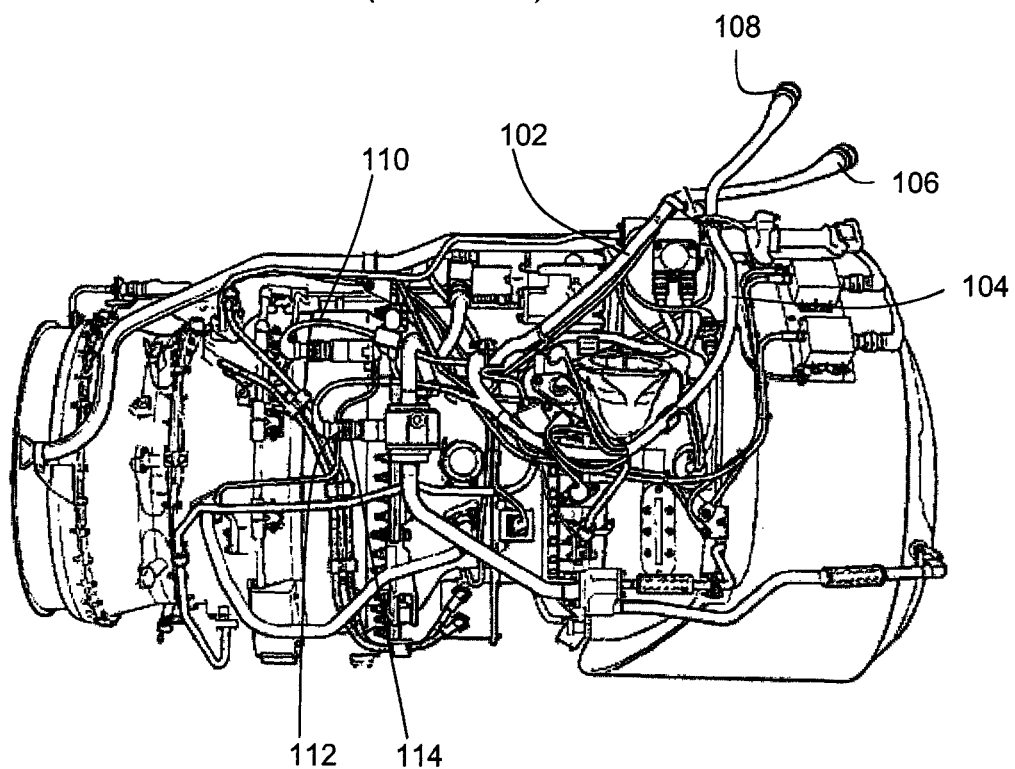
FIG. 2 shows a gas turbine engine with a conventional harness.
Figure 3:
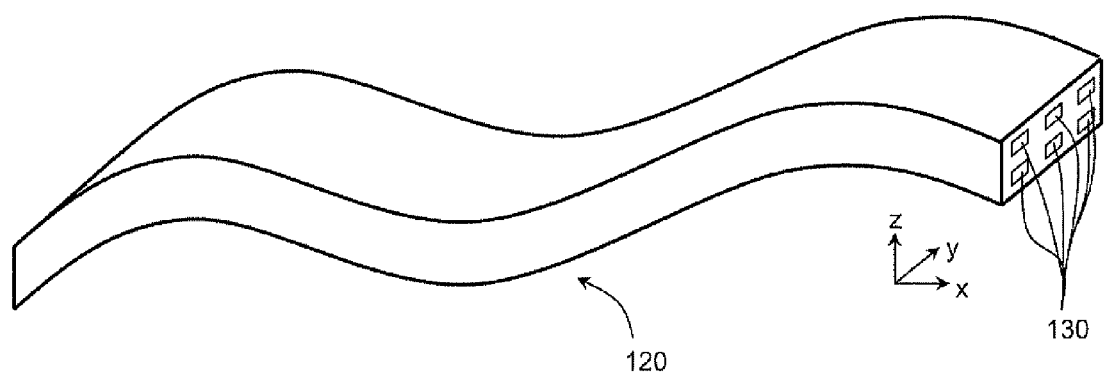
FIG. 3 shows a schematic perspective view of a portion of a flexible printed circuit board harness.
Figure 4:
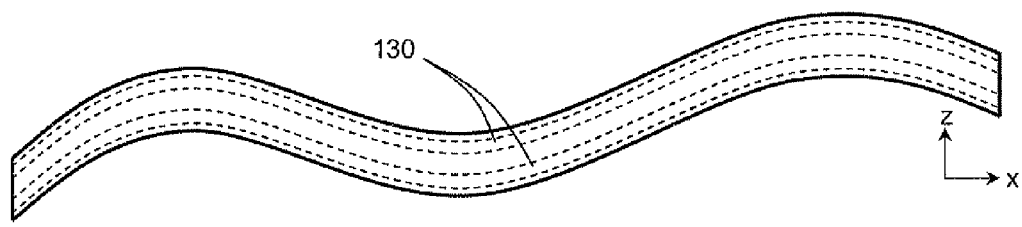
FIG. 4 shows a side view of the flexible printed circuit board harness of FIG. 3.
Figure 5:
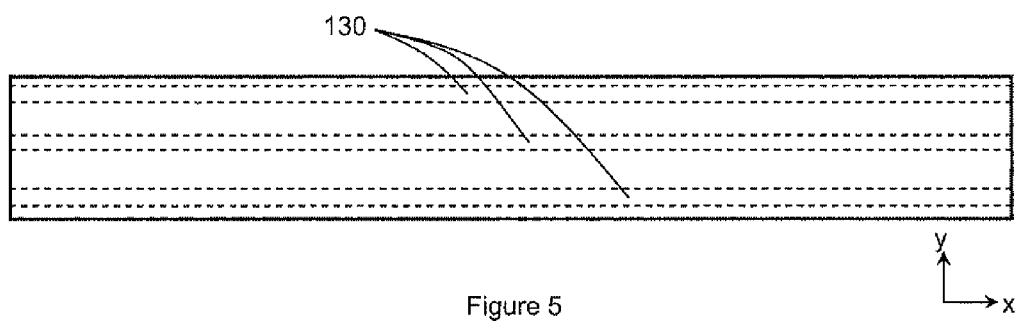
FIG. 5 shows a top view of the flexible printed circuit board harness of FIG. 3.
Figure 6:
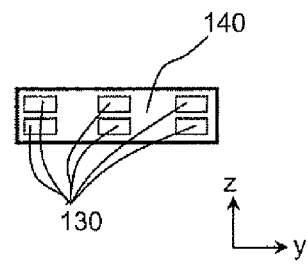
FIG. 6 shows a transverse cross-sectional view of the flexible printed circuit board harness of FIG. 3.
Figure 7:
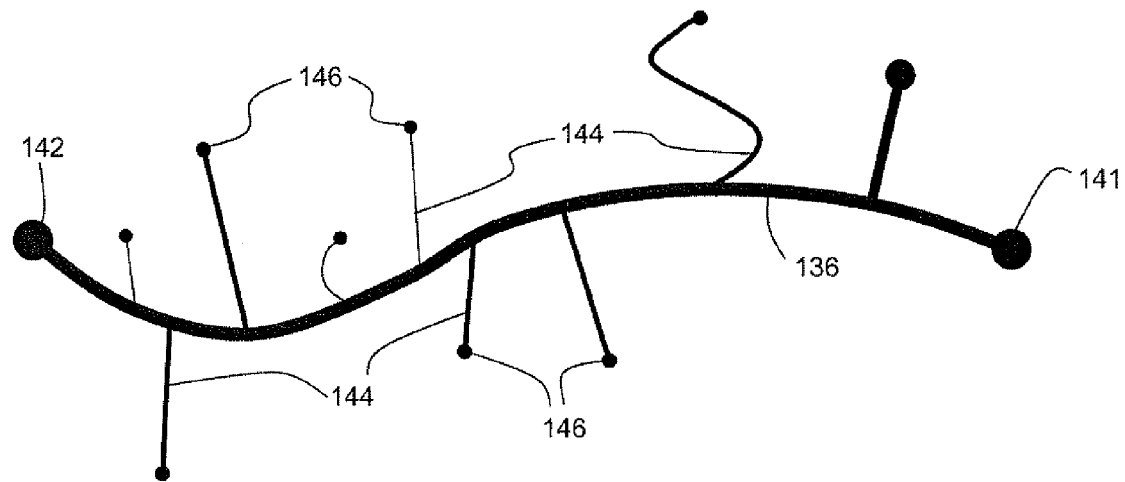
FIG. 7 shows a diagrammatic representation of a flexible printed circuit board harness for an engine.
Figure 8:
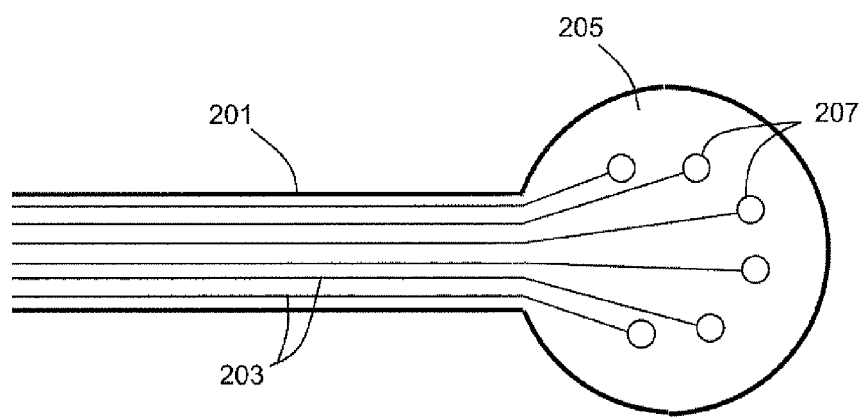
FIG. 8 shows schematically a portion of an electrical harness formed from a flexible printed circuit board.

FIG. 8 shows schematically a portion of a gas turbine engine electrical harness formed from a flexible printed circuit board 201 which provides a plurality of conductive tracks 203, optionally in multiple layers. The portion ends at a planar, disc-shaped terminating region 205 in which the conductive tracks fan out and join to respective receiving holes 207 which penetrate through the terminating region perpendicularly to the plane of the region. The holes are internally plated with an electrically conductive layer.

Figure 9:
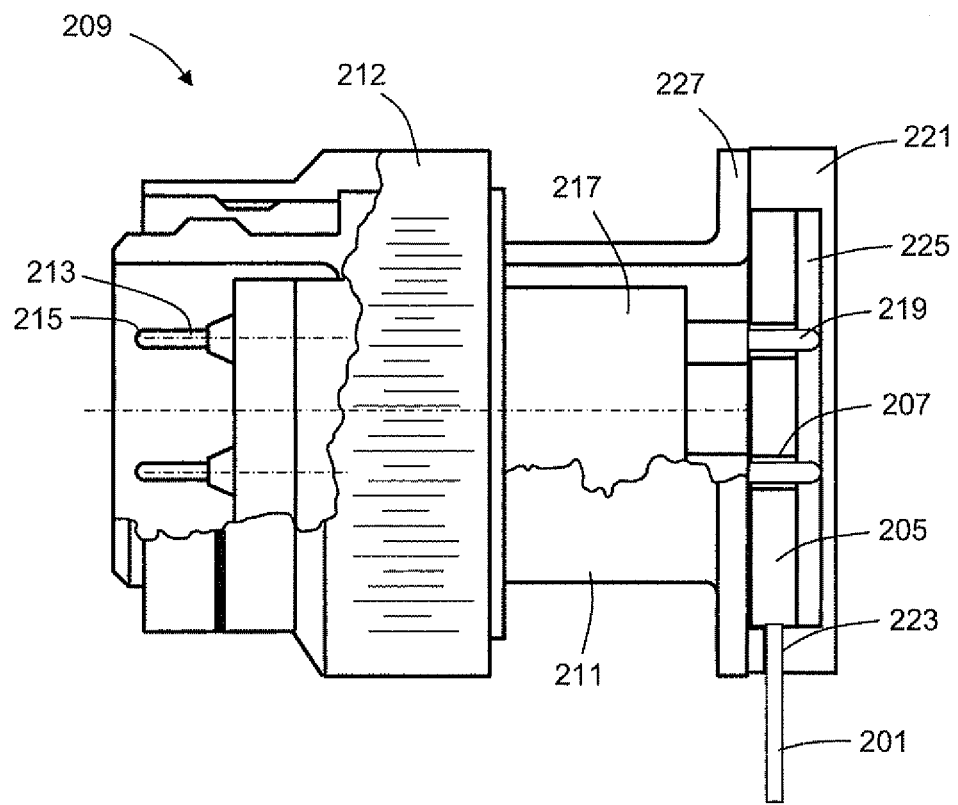
FIG. 9 shows a partial longitudinal cross-sectional view through a harness connector which makes a detachable press fit connection to the terminating region of the harness of FIG. 8.

FIG. 9 shows a partial longitudinal cross-sectional view through a harness connector 209 which makes a detachable press fit connection to the terminating region 205. In use, the connector 209 joins with a complementary connector (not shown), e.g. at an electrical component on a gas turbine engine.

The connector 209 has a substantially cylindrical back-shell 211 which contains a plurality of axially aligned elongate terminals 213. A fastening ring 212 surrounding the back-shell 211 is arranged to reversibly mechanically fasten to a back-shell of the complementary connector in a manner known to the skilled person. The terminals are held by a retaining body 217 within the back-shell 211 so that, in use, male ends 215 of the terminals are presented at one side of the connector to female ends of corresponding terminals of the complementary connector. In other examples, the terminals 213 can have female ends which are presented to male ends of corresponding terminals of the complementary connector. The female ends may contain a sprung mechanism/restriction which reduces the internal diameter of the end and presses on the male end to ensure good mechanical and electrical contact. Although not shown in FIG. 9, the connector 209 may have rubber boot to discourage the ingress of contaminants into the connector and to provide support for the flexible harness as it leaves the connector.

The terminals 213 extend within the back-shell 211 to male ends 219 at the other side of the connector. The terminating region 205 of the harness is press fitted to the ends 219 such that the ends 217 enter respective of the receiving holes 207. In this way, electrical connections are made between the conductive tracks 203 and the terminals 213. Conveniently, the press fit connection avoids permanent joining (e.g. by soldering or mechanical crimping) of the terminating region and the terminals, thus allowing the terminating region to be easily detached from the terminals if necessary.

The press fit engagement of the terminating region 205 onto the ends 219 is facilitated by a detachable lid 221 of the back-shell 211, the lid being detached in order for the terminating region to be fitted onto the ends 219, and re-secured to the back-shell thereafter. The flexible harness exits the connector at an aperture 223 in the lid, and, due to the receiving holes 207 being perpendicular to the plane of the terminating region 205, in a direction which is perpendicular to the joining direction of the harness connector 209 and complementary connector. A layer 225 of resilient elastomer is sandwiched between the lid and the terminating region so that, when the lid is re-secured to the back-shell, the elastomer is compressed and urges the terminating region into engagement with a flange formation 227 of the back-shell. This helps to prevent the terminating region vibrating in the back-shell, which can lead to fretting and premature failure of the connector. The elastomer layer 225 can be a separate component, or a part of the terminating region 205 and/or the lid 221. Likewise, the lid can be a separate component or a part of the terminating region. The terminals can extend through the layer 225 (as shown in FIG. 9), or alternatively they can fall short of the lid 221 (and optionally then abut the layer 225).

Because the retaining body 217 supports the terminals 213 within the back-shell 211 independently of their connection with mating terminals of the complementary connector and independently of the press fit connection with the terminating region 205, the terminating region and/or the complementary connector can be disconnected from the harness connector with reduced risk that the terminals will be lost or damaged. In this way, the on-wing replacement capability of the harness and harness connector can be improved. Also the use of hot joining techniques, such as soldering, which are incompatible with on-wing working on a fuelled engine, can be avoided.

Figure 10:
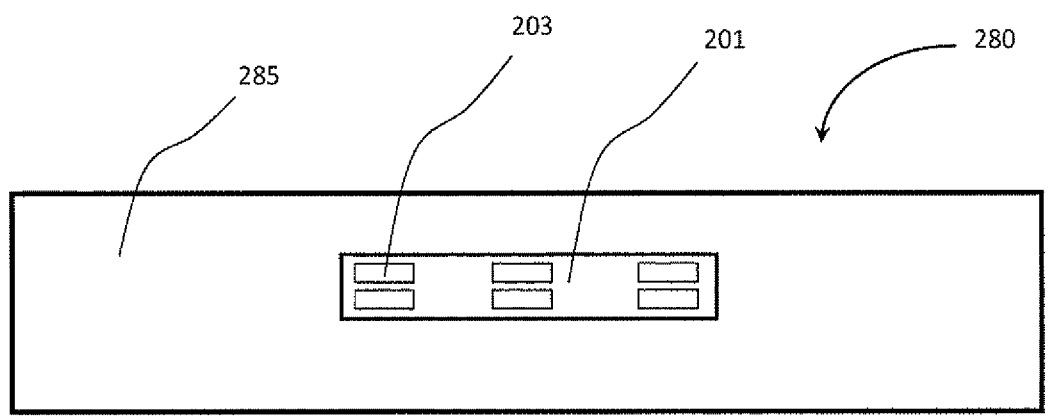
FIG. 10 shows a diagrammatic representation of a flexible printed circuit board embedded in a rigid material.

At least a part of the flexible printed circuit board 201 may be embedded in a rigid material 285, as shown in FIG. 10 by way of example. For example, along at least a part of its length, the flexible printed circuit board 201 may be fixed inside a rigid material to form a rigid structure 280, which may be referred to as a rigid raft 280. Thus, the electrical harness may comprise rigid structure through which the flexible printed circuit board 201 runs. Such a rigid structure may be readily mounted on or fixed to another component, for example a gas turbine engine.

The rigid material 285 may be, for example, a composite material of fibre and filler, such as carbon fibre. Any suitable method may be used to manufacture such a rigid structure 280 such as, for example, placing the flexible printed circuit board 201 between flexible layers of a composite material (or "laying-up" the flexible composite material), and then moulding to the desired shape and treating (for example heat and/or pressure treating) to form a rigid composite structure.

In examples having a part of the flexible printed circuit board 201 embedded in a rigid material 285 to form a rigid structure 280, the terminating regions 205 may not be embedded.

While the invention has been described in conjunction with the exemplary embodiments described above, many equivalent modifications and variations will be apparent to those skilled in the art when given this disclosure. For example, the back-shell 211 may incorporate a bonding feature for grounding electro-magnetic shielding of the flexible harness to the back-shell. Accordingly, the exemplary embodiments of the invention set forth above are considered to be illustrative and not limiting. Various changes to the described embodiments may be made without departing from the spirit and scope of the invention.

All references referred to above are hereby incorporated by reference.

We claim:

1. An electrical harness formed from a flexible printed circuit board, the harness comprising:
    the flexible printed circuit board comprising at least one terminating region and being configured to form the harness and to be wound around at least a part of a gas turbine engine, at least a portion of the flexible printed circuit board being enclosed in an elastically deformable material;

a plurality of conductive tracks; and
at least one harness connector at the at least one terminating region of the flexible printed circuit board configured to join the harness to a complementary connector, wherein
the harness connector includes a back-shell and at least one elongate terminal supported at a position within the back-shell such that, in use, when the harness connector joins with the complementary connector, the elongate terminals are presented for electrical connection at a first connection end thereof with mating terminals of the complementary connector,
the at least one terminating region of the flexible printed circuit board has at least one receiving hole penetrating through the at least one terminating region perpendicularly to a plane of the at least one terminating region and joining to the respective conductive track of the harness, the at least one terminating region being covered by a detachable lid of the back-shell and making a detachable press fit connection to the respective harness connector such that a second connection end of the elongate terminal of the harness connector is received in the receiving hole to electrically connect the elongate terminal with the conductive track, the detachable lid being detachable from the rest of the back-shell to facilitate engagement and detachment of the at least one terminating region to the harness connector,
the elongate terminal is supported within the harness connector such that, when the harness connector is disconnected from the complementary connector, and when the at least one terminating region is detached from the harness connector, the elongate terminal retains said position within the back-shell,
the elongate terminal extends substantially perpendicularly to the plane of the at least one terminating region of the flexible printed circuit board, and
the flexible printed circuit board has a length dimension that is greater than a width dimension, the flexible printed circuit board and the plurality of conductive tracks formed therein extend away from the at least one terminating region in the direction of the length dimension so as to form the electrical harness.

2. An electrical harness according to claim 1, wherein the conductive tracks of the harness fan out in the at least one terminating region.

3. An electrical harness according to claim 1, wherein substantially the whole of the inner surface of the at least one receiving hole is coated with an electrically conducting layer.

4. An electrical harness according to claim 1, wherein the at least one terminating region is substantially planar and the at least one receiving hole is arranged such that the at least one elongate terminal extends out of the plane of the at least one terminating region.

5. An electrical harness according to claim 4, wherein the at least one terminating region is disc-shaped.

6. An electrical harness according to claim 1, wherein the at least one harness connector further includes a fixation formation configured to urge the respective at least one terminating region into engagement with the back-shell.

7. An electrical harness according to claim 6, wherein the fixation formation comprises a resilient member configured to be compressed between the at least one terminating region and the lid.

8. An electrical harness according to claim 1, wherein a part of the flexible printed circuit board is embedded in a rigid material.

9. An electrical harness according to claim 8, wherein the rigid material is a rigid composite material.

10. A gas turbine engine having the electrical harness according to claim 1.

11. An electrical harness according to claim 1, wherein the length dimension of the flexible printed circuit board is at least 5 times greater than the width dimension.

12. An electrical harness according to claim 1, wherein the flexible printed circuit board comprises a plurality of terminating regions,
the harness comprises a plurality of harness connectors at respective terminating regions, and
the flexible printed circuit board is wound around the at least the part of the gas turbine engine between respective harness connectors.

* * * * *